United States Patent [19]
Scepanovic et al.

[11] Patent Number: 5,859,782
[45] Date of Patent: Jan. 12, 1999

[54] EFFICIENT MULTIPROCESSING FOR CELL PLACEMENT OF INTEGRATED CIRCUITS

[75] Inventors: Ranko Scepanovic, San Jose, Calif.; Alexander E. Andreev, Moskovskaga Oblast, Russian Federation; Ivan Pavisic, Cupertino, Calif.

[73] Assignee: LSI Logic Corporation, Milpitas, Calif.

[21] Appl. No.: 798,648

[22] Filed: Feb. 11, 1997

[51] Int. Cl.⁶ .............................. G06F 17/50; G06F 17/10
[52] U.S. Cl. .......................... 364/491; 364/488; 364/489; 364/490
[58] Field of Search .................................. 364/488–491, 364/578

[56] References Cited

U.S. PATENT DOCUMENTS

| | | | |
|---|---|---|---|
| 5,491,641 | 2/1996 | Scepanovic et al. | 364/491 |
| 5,495,419 | 2/1996 | Rostoker et al. | 364/468 |
| 5,557,533 | 9/1996 | Koford et al. | 364/491 |
| 5,568,322 | 10/1996 | Azami et al. | 359/689 |
| 5,568,636 | 10/1996 | Koford | 395/500 |
| 5,578,840 | 11/1996 | Scepanovic et al. | 257/207 |
| 5,599,265 | 2/1997 | Scepanovic et al. | 364/491 |
| 5,615,128 | 3/1997 | Scepanovic et al. | 364/489 |
| 5,636,125 | 6/1997 | Rostoker et al. | 364/468.28 |
| 5,638,292 | 6/1997 | Ueda | 364/491 |
| 5,638,293 | 6/1997 | Scepanovic et al. | 364/491 |
| 5,661,663 | 8/1997 | Scepanovic et al. | 364/490 |
| 5,682,322 | 10/1997 | Boyle et al. | 364/491 |
| 5,699,265 | 12/1997 | Scepanovic et al. | 364/491 |
| 5,712,793 | 1/1998 | Scepanovic et al. | 364/490 |
| 5,742,510 | 4/1998 | Rostoker et al. | 364/468.03 |
| 5,745,363 | 4/1998 | Rostoker et al. | 364/468.28 |

OTHER PUBLICATIONS

Rose et al., "Parallel standard cell placement algorithms with quality equivalent to simulated annealing", IEEE Transactions on Computer–Aided Design of Integrated Circuit and Systems, Mar. 1988, vol. 7, No. 3, pp. 387–396, Mar. 1988.

Scherber et al., "PALACE: A parellel and hierarchical layout analyzer and circuit extractor", IEEE Comput. Soc. Press, Proceedings of European Design and Test Conference, 11 Mar. 1996, pp. 357–361, Mar. 11, 1996.

Banerjee et al., "Parallel simulated annealing algorithms for cell placement on hypercube multiprocessors", IEEE Transactions on Parallel and Distributed Systems, Jan. 1990, vol. 1, No. 1, pp. 91–106, Jan. 1990.

Kling et al., "Esp: Placement by simulated evolution", IEEE Transactions on Computer–Aided Design of Integrated Circuits and Systems, Mar. 1989, vol. 8, p. 245–256, Mar. 1989.

Chen et al., "A fast parallel algorithm for slicing floorplans", IEEE, Proceedings of the 1993 IEEE International Symposium on Circuits and Systems, 3 May 1993, pp. 1774–1777, May 3, 1993.

Kravitz et al., "Placement by Simulated Annealing on Multiprocessor", IEEE Transactions on Computer–Aided Design, vol. CAD–6, No. 5, Jul. 1987, pp. 534–549, Jul. 1987.

*Primary Examiner*—Kevin J. Teska
*Assistant Examiner*—Phallaka Kik
*Attorney, Agent, or Firm*—Mitchell, Silberberg & Knupp LLP

[57] ABSTRACT

A method for maximizing effectiveness of parallel processing, using multiple processors, to achieve an optimal cell placement layout of a core area of an integrated chip is disclosed. The method requires the core area to be divided into preferably a grid of rectangular regions. Then, the rectangular region is sequenced such that each region of the sequence is not adjacent to the previous or the next region of the sequence, and is sufficiently far from the previous and from the next region of the sequence such that when multiple processors are assigned to consecutive regions of the sequence to perform cell placement algorithms, area-conflicts are minimized eliminating the need to limit the distances the cells may be moved.

39 Claims, 5 Drawing Sheets

EFFICIENT MULTIPROCESSING FOR CELL PLACEMENT OF INTEGRATED CIRCUITS

BACKGROUND OF THE INVENTION

1. Field of the Invention

The present invention generally relates to the art of microelectronic integrated circuit layout, and more specifically to the art of placement of cells on integrated circuit chips.

2. Description of Related Art

Microelectronic integrated circuits (ICs) consist of a large number of electronic components which are fabricated by layering several different materials on a silicon base or wafer. The design of an integrated circuit (IC) transforms a circuit description into a geometric description which is known as a layout. A layout consists of a set of planar geometric shapes in the various layers of the silicon chip.

The process of converting the specifications of an electrical circuit into a layout is called physical design. Physical design requires arranging elements, wires, and predefined cells on a fixed area, and the process can be tedious, time consuming, and prone to many errors due to tight tolerance requirements and the minuteness of the individual components, or cells.

Currently, the minimum geometric feature size of a component is on the order of 0.5 microns. Feature size may be reduced to 0.1 micron within the next several years. The current small feature size allows fabrication of as many as 10 million transistors or approximately 1 million gates of logic on a 25 millimeter by 25 millimeter chip. This feature-size-decrease/transistor-increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design use extensively Computer Aided Design (CAD) tools. Automation of the physical design process has increased the level of integration, reduced turn around time and enhanced chip performance.

The object of physical chip design is to determine an optimal arrangement of devices in a plane and to find an efficient interconnection or routing scheme between the devices that results in the desired functionality. Since space on the chip surface is at a premium, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnection wire network, or net. A purpose of the optimization process used in the physical design stage is to determine a cell placement such that all of the required interconnections can be made, but total wirelength and interconnection congestion are minimized.

Typical methods for achieving this goal include generating one or more initial placements and modifying the placement or placements using optimization methodologies such as simulated annealing, genetic algorithms (i.e. simulated evolution), and force directed placement. Each of these techniques involve iterative applications of the respective algorithms to arrive at an estimate of the optimal arrangement of the cells.

Depending on the input, placement algorithms are classified into two major groups, constructive placement algorithms and iterative improvement algorithms. The input to the constructive placement algorithms consists of a set of blocks along with the netlist. The algorithm provides locations for the blocks. Iterative improvement algorithms start with an initial placement. These algorithms modify the initial placement in search of a better placement. The algorithms are applied in a recursive or an iterative manner until no further improvement is possible, or the solution is considered to be satisfactory based on certain predetermined criteria.

Iterative algorithms function by generating large numbers of possible placements and comparing them in accordance with some criteria which is generally referred to as fitness. The fitness of a placement can be measured in a number of different ways, for example, overall chip size. A small size is associated with a high fitness and a large size is associated with a low fitness. Another measure of fitness is the total wire length of the integrated circuit. A high total wire length indicates low fitness and a low total wire length, on the other hand, indicates high fitness. One cell placement optimization system is described in U.S. patent application Ser. No. 08/672,725. Applicants hereby incorporate the specification, including the drawings, of said application herein as though set forth in full.

The relative desirability of various placement configurations can alternatively be expressed in terms of cost, which can be considered as the inverse of fitness, with high cost corresponding to low fitness and, similarly, low cost corresponding to high fitness.

Iterative algorithms can generally be divided into three classifications: simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Because of the large number of possible placements, computerized implementation of the placement algorithms discussed above can take many days. In addition, the placement algorithm may need to be repeated with different parameters or different initial arrangements to improve the results.

To reduce the time required to place optimally the cells, multiple processors have been used to speed up the process. In such implementations, multiple processors operate simultaneously to place optimally the cells on the integrated chip. However, such prior efforts to reduce the placement time by parallel processing of the placement methods have been impeded by three obstacles.

First, multiple processors may conflict with each other. This occurs where an area on the chip, which is being processed by one processor, is affected by movements of one or more cells into the area by another processor. When this occurs, one of the two conflicting processors must wait for the other to finish or postpone its own move for later. The area-conflict problem not only lessens the advantage of multiprocessing, but also increases the processing overhead encountered. This is because, before moving a cell, each of the processors must check for area-conflicts with all other processors. As the number of processors increases, the area-conflicts increase rapidly to negate the advantage of multiprocessing, such that the time required to place the cells is increased.

Second, the optimization process can become trapped in a local optimum. To eliminate the area-conflict problem, some systems have assigned particular core areas to each of the processors with the restriction that each of the processors only operate within its assigned area. After processing cells of the assigned areas, the processors are then assigned to different areas, and so on. Although this method eliminates area-conflicts, it limits the movements of the cells to the area assigned to the processor. The limitation on the movement of the cells increases the likelihood of the placement becoming stuck at a local optimum. In the case of a pairwise interchange algorithm, it is possible that a configuration achieved is at a local optimum such that any further exchange within the limited area will not result in a further reduction in cost. In such a situation, the algorithm is trapped at the local optimum and does not proceed further. This happens frequently when the algorithm is used in practical applications, and the extent of the local optimum problem increases as additional processors are added because the increase in the number of processors operating simultaneously reduces the area assigned to each of the processors. Decreases in the area assigned to each of the processors lead to corresponding decreases of the distances the cells of the areas may be moved to improve the optimization.

Third, if multiple processors are used simultaneously to place the cells of an integrated chip, it is possible for the processors to deadlock. This occurs where each of the processors has halted its operation while waiting for another processor to complete its operations. In this situation, all processing is stopped and the system halts. An example of deadlock is where processor $P_1$ is waiting for processor $P_2$ to complete its operation, $P_2$ is waiting for processor $P_3$ to complete its operation, and $P_3$ is waiting for $P_1$ to complete its operation. In that case, neither $P_1$, $P_2$, nor $P_3$ will proceed.

In summary, because of the ever-increasing number of cells on an integrated chips (currently at millions of cells on a chip), and the resulting increase in the number of possible placements of the cells on the chip, a computer is used to find an optimal layout of the cells on the chip. Even with the aid of computers, existing methods can take several days to place a large number of cells, and these methods may need to be repeated with different parameters or different initial arrangements. To decrease the time required to place the chip, multiple processors have been used to perform the placement of the cells. However, the use of multiple processors has led to area-conflicts, local optimum problems, and potential deadlock situations, negating the advantages of using the multiple processors.

SUMMARY OF THE INVENTION

According to the present invention, there is provided a method and apparatus for maximizing effectiveness of parallel processing to achieve an optimal placement of elements on a surface. The method is realized by dividing the surface into a plurality of regions, assigning a set of non-adjacent regions to each of the multiple processors, and allowing each of the multiple processors to process the elements of the regions to which it has been assigned. In particular, the disclosed method and apparatus is applied to cells of an integrated circuit chip (IC) as the elements and the IC itself as the surface.

Because each of the multiple processors is operating upon a non-adjacent region at any one time, most of the cell movements of one processor are "far enough" from the cell movements of the other processes so as to minimize conflict between processors. Consequently, no limits need be placed upon the areas within which a processor operates or cell movements are made. Because the cell moves allowed by the invention disclosed herein are not limited, acceptance of undesirable local optimal solutions is avoided.

The determination of non-adjacency of the regions processed simultaneously by multiple processors may be accomplished by: (1) dividing the core area into a plurality of rectangular regions of M columns by N rows; (2) 'determining the "interval parameter" for both the columns and for rows; and (3) determining a sequence in which the rectangular regions are to be processed such that each set of simultaneously processed regions contains regions which are sufficiently distant from each other to avoid conflicts. Depending upon the degree to which one wants to avoid area-conflict and local optimum problems, the distance between regions processed simultaneously may be varied.

An apparatus for placing cells using parallel processing technique comprises a plurality of processors and memory. The memory stores instructions for the processors to divide the area of the circuit chip into a plurality of regions and successively assign regions, which are not adjacent to the regions being processed by the other processors at the time of the assignment, to each of the processors. Then, the processors, operating simultaneously, are working on non-adjacent regions.

A system for placing cells using parallel processing technique comprises a computer with multiple processors and memory. The memory stores instructions for the processors to divide the area of the circuit chip into a plurality of regions and successively assign regions, which are not adjacent to the regions being processed by the other processors at the time of the assignment, to each of the processors.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Figure 1:
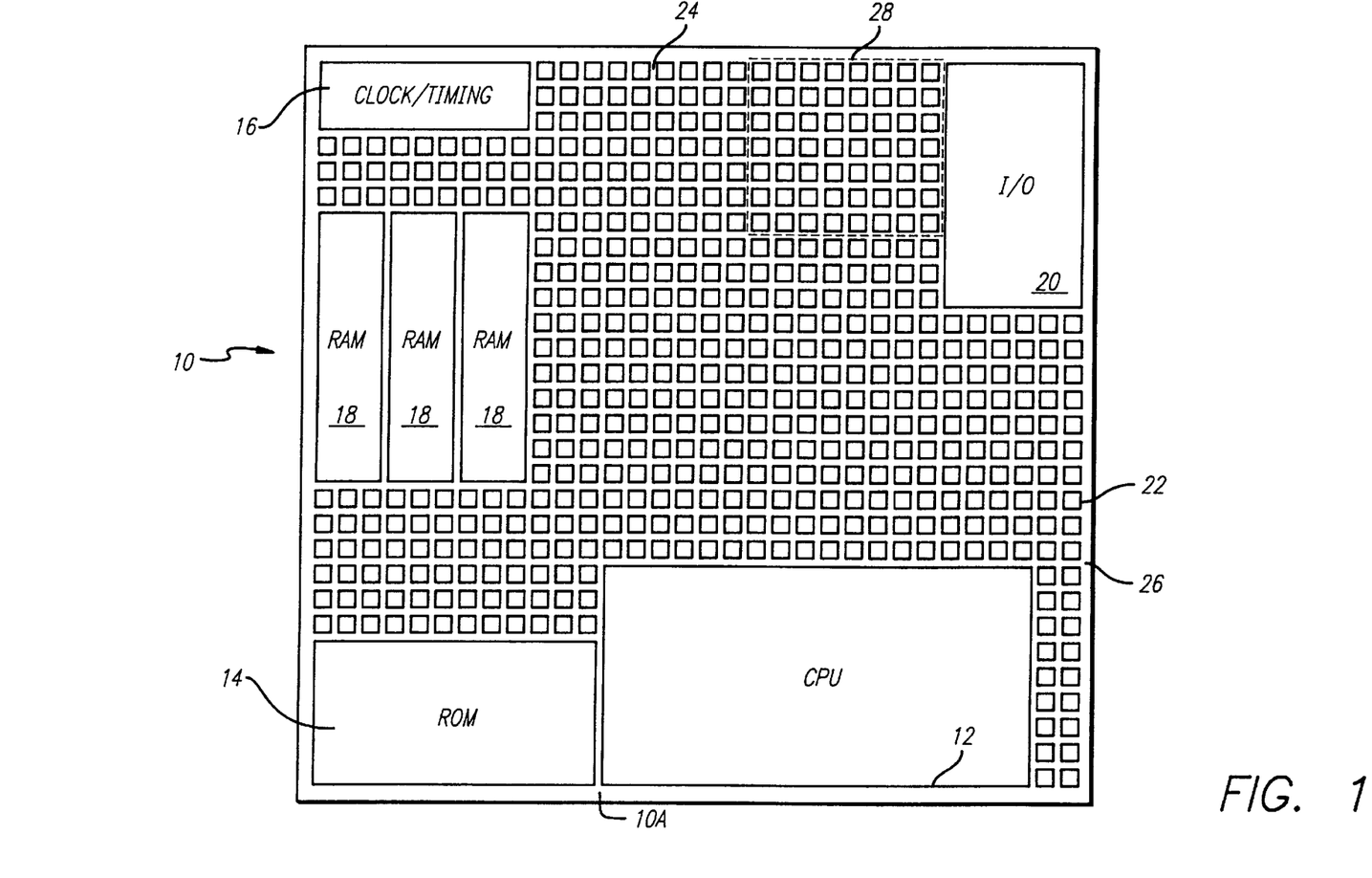
FIG. 1 is an illustration of an exemplary integrated circuit chip.

An exemplary integrated circuit chip is illustrated in FIG. 1 and generally designated by the reference numeral 10. The circuit 10 includes a semiconductor substrate 10A on which are formed a number of functional circuit blocks that can have different sizes and shapes. Some are relatively large, such as a central processing unit (CPU) 12, a read-only memory (ROM) 14, a clock/timing unit 16, one or more random access memories (RAM) 18 and an input/output (I/O) interface unit 20. These blocks, commonly known as macroblocks, can be considered as modules for use in various circuit designs, and are represented as standard designs in circuit libraries.

The integrated circuit 10 further comprises a large number of small cells 22 which can be tens of thousands, hundreds of thousands, or even millions or more. Each cell 22 represents a single logic element, such as a gate, or several logic elements interconnected in a standardized manner to perform a specific function. Cells that consist of two or more interconnected gates or logic elements are also available as standard modules in circuit libraries.

The cells 22 and the other elements of the circuit 10 described above are interconnected or routed in accordance with the logical design of the circuit so as to provide the desired functionality. Although not visible in the drawing, the various elements of the circuit 10 are interconnected by electrically conductive lines or traces that are routed, for example, through vertical channels 24 and horizontal channels 26 that run between the cells 22.

For cell placement purposes, the entire integrated circuit 10, including all of its components (12, 14, 16, 18, 20, and 22), may be processed under one of the placement algorithms discussed above. It is also possible to process a subset or a sub-area 28 of the circuit 10. For the purposes of this discussion, the phrase "core area" will refer to the area of the integrated circuit 10 which is being processed for optimal cell placement.

Figure 2:
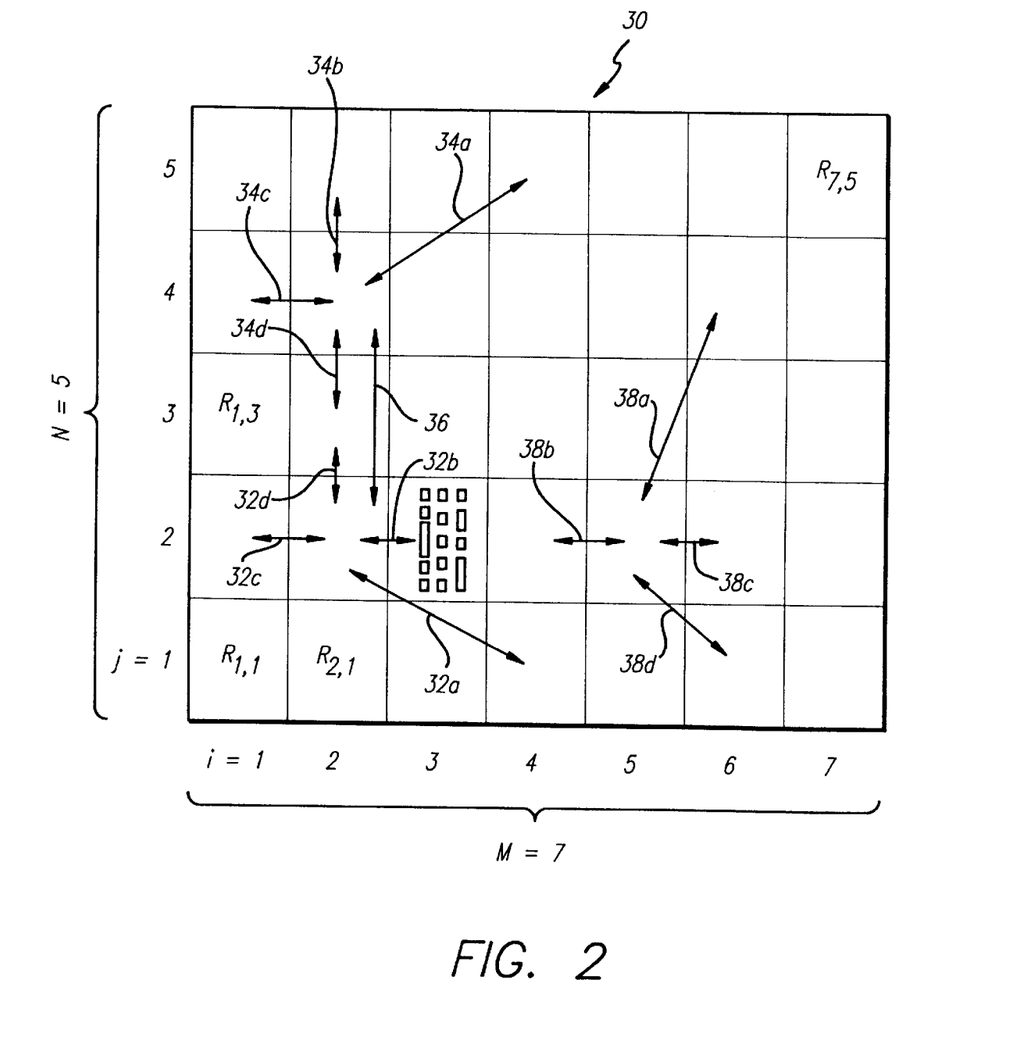
FIG. 2 illustrates a possible partitioning of a core region.

FIG. 2 illustrates one possible partitioning of a core area 30 into a plurality of regions. Although the regions may be of any shape and configuration, FIG. 2 shows the core area 30 being divided into a rectangular grid of seven (7) columns and five (5) rows. The number of columns, denoted as M, and the number of rows, denoted as N, may be arbitrarily assigned. Typically, however, M is set as one half of the number of cell columns in the core area, and N is set as the same number, resulting in a square grid.

To simplify the discussion, this specification will refer to each of the regions of the grid as $R_{i,j}$ where i refers to the column and j refers to the row on which the region $R_{i,j}$ is located. Again, referring to FIG. 2, the region located at the bottom, left corner of the core area 30 is identified as $R_{1,1}$, the region adjacent to and to the right of $R_{1,1}$ is identified as $R_{1,2}$. Also in FIG. 2, regions $R_{1,3}$ and $R_{7,5}$ are identified. For simplicity, other regions are not specifically identified. In addition, each of the regions contain a large number of cells to be placed. Cells are not shown by FIG. 2, except that a representation of cells is shown in region $R_{3,2}$.

FIG. 2 also illustrates cell swaps between regions of the core area 30, which are required by the optimization process to improve the fitness of the placement. The cell swaps are represented by double-pointed arrows 32a, 32b, 32c, 32d, 34a, 34b, 34c, 34d, 36, 38a, 38b, 38c, 38d.

For the purposes of our discussion, it is assumed that three (3) processors—$P_1$, $P_2$, and $P_3$—are used to process simultaneously the cell placement algorithm.

If the regions are assigned to the processors sequentially, then the order in which the regions are processed and the processor assignments to the regions might be as shown below in Table 1.

TABLE 1

| Row | | | | | | | |
|---|---|---|---|---|---|---|---|
| 5 | 5 ($P_2$) | 10 ($P_1$) | 15 ($P_3$) | 20 ($P_2$) | 25 ($P_1$) | 30 ($P_3$) | 35 ($P_2$) |
| 4 | 4 ($P_1$) | 9 ($P_3$) | 14 ($P_2$) | 19 ($P_1$) | 24 ($P_3$) | 29 ($P_2$) | 34 ($P_1$) |
| 3 | 3 ($P_3$) | 8 ($P_2$) | 13 ($P_1$) | 18 ($P_3$) | 23 ($P_2$) | 28 ($P_1$) | 33 ($P_3$) |
| 2 | 2 ($P_2$) | 7 ($P_1$) | 12 ($P_3$) | 17 ($P_2$) | 22 ($P_1$) | 27 ($P_3$) | 32 ($P_2$) |
| j = 1 | 1 ($P_1$) | 6 ($P_3$) | 11 ($P_2$) | 16 ($P_1$) | 21 ($P_3$) | 26 ($P_2$) | 31 ($P_1$) |
| | i = 1 | 2 | 3 | 4 | 5 | 6 | 7 |
| | Column | | | | | | |

The entire Table 1 represents the core area 30 of FIG. 2, and each of the rectangular areas of the table represent the corresponding rectangular region of FIG. 2. In the table, each of the regions has a number. The number corresponds to the region's rank in the order of processing. The specific processor which will process the cells of the region is also identified. Table 2 below sets forth the order in which the cells of the regions are processed by the processors.

TABLE 2

| Iteration | Set of regions simultaneously processed by $P_1$, $P_2$, and $P_3$ |
|---|---|
| 1 | $R_{1,1}$, $R_{1,2}$, and $R_{1,3}$ |
| 2 | $R_{1,4}$, $R_{1,5}$, and $R_{2,1}$ |
| 3 | $R_{2,2}$, $R_{2,3}$, and $R_{2,4}$ |
| ... | ... |
| 11 | $R_{7,1}$, $R_{7,2}$, and $R_{7,3}$ |
| 12 | $R_{7,4}$ and $R_{7,5}$ |

Under the cell placement process described above, the first set of regions $R_{1,1}$, $R_{1,2}$, and $R_{1,3}$ is processed by the three processors simultaneously. Then, the second set of regions is processed simultaneously, followed by the simultaneous processing of the third set of regions, and so on. However, as is discussed in detail below, simultaneous processing of the third set of regions—$R_{2,2}$, $R_{2,3}$, and $R_{2,4}$—generates the area-conflict, local optimum, and deadlock problems described above.

As illustrated by FIG. 2, regions $R_{2,2}$, $R_{2,3}$, and $R_{2,4}$ require the indicated cell movements, or cell swaps, to increase the fitness of the placement. The required cell movements are detailed in Table 3 below.

TABLE 3

| | |
|---|---|
| R2,2 | Cell movements 32a between $R_{2,2}$ and $R_{4,1}$; |
| | Cell movements 32b between $R_{2,2}$ and $R_{3,2}$; |
| | Cell movements 32c between $R_{2,2}$ and $R_{1,2}$; |
| | Cell movements 32d between $R_{2,2}$ and $R_{2,3}$; and |
| | Cell movements 36 between $R_{2,2}$ and $R_{2,4}$. |
| R2,3 | Cell movements 32d between $R_{2,3}$ and $R_{2,2}$; and |
| | Cell movements 34d between $R_{2,3}$ and $R_{2,4}$. |
| R2,4 | Cell movements 34a between $R_{2,4}$ and $R_{4,5}$; |
| | Cell movements 34b between $R_{2,4}$ and $R_{2,5}$; |
| | Cell movements 34c between $R_{2,4}$ and $R_{1,4}$; |
| | Cell movements 34d between $R_{2,4}$ and $R_{2,3}$; and |
| | Cell movements 36 between $R_{2,4}$ and $R_{2,2}$. |

In this scenario, three sets of area-conflict problems arise. The first area-conflict is between $P_1$ (processing $R_{2,2}$) and $P_2$ (processing $R_{2,3}$). Both $P_1$ and $P_2$ are attempting to make cell movements 32d into and out of the region being processed by the other processor. Likewise, due to the cell movements 36, the second area-conflict is between $P_1$ and $P_3$ (processing $R_{2,4}$). The third area-conflict is between $P_2$ and $P_3$ due to the cell movements 34d. Because of these conflicts, the parallel processing cannot be accomplished simultaneously. This is because at least one of the processors must wait for another to complete the cell movements in the conflicting regions before processing its own cells.

By constraining cell movements to adjacent regions only, the cell movement 36 is eliminated from consideration, and the area-conflict between $P_1$ (processing $R_{2,2}$) and $P_3$ (processing $R_{2,4}$) is eliminated. However, the restriction of the movement of cells only to adjacent regions may eliminate cell movements which could result in a better overall fitness (global optimum). This is because the restriction traps the optimization process at an undesirable local optimum solution. In FIG. 2, if the cell movements are restricted to adjacent cells only, movements 32a, 34a, 36, and 38a are eliminated.

The final problem arising out of the current scenario is a possibility of a deadlock between the processors. If, for example, $P_1$ is waiting for $P_2$ to complete the cell movement 32d, $P_2$ is waiting for $P_3$ to complete the movement 34d, and $P_3$ is waiting for $P_1$ to complete the movement 36, a deadlock is created.

All three problems discussed above can be minimized, or eliminated, if any two processors are, at any one time, operating sufficiently distant from each other to avoid area-conflicts. Automated assignments of regions to multiple processors for simultaneous processing such that the regions are sufficiently distant to avoid area conflicts is an important aspect of the present invention. The assignment is accomplished as follows: (1) dividing the core area into a plurality of rectangular regions of M columns by N rows; (2) determining the "interval parameter" for both the columns and for rows; and (3) determining a sequence in which the rectangular regions are to be processed such that each set of simultaneously processed regions contains regions which are sufficiently distant from each other to avoid conflicts.

Consequently, when the multiple processors are assigned to the regions, each of the processors will be processing cells of a region far enough from the other regions being processed at that time such that area-conflict and deadlock problems are greatly reduced. In addition, the need to restrict the movements of cells, which creates local optimum problem, is also eliminated.

Figure 3:
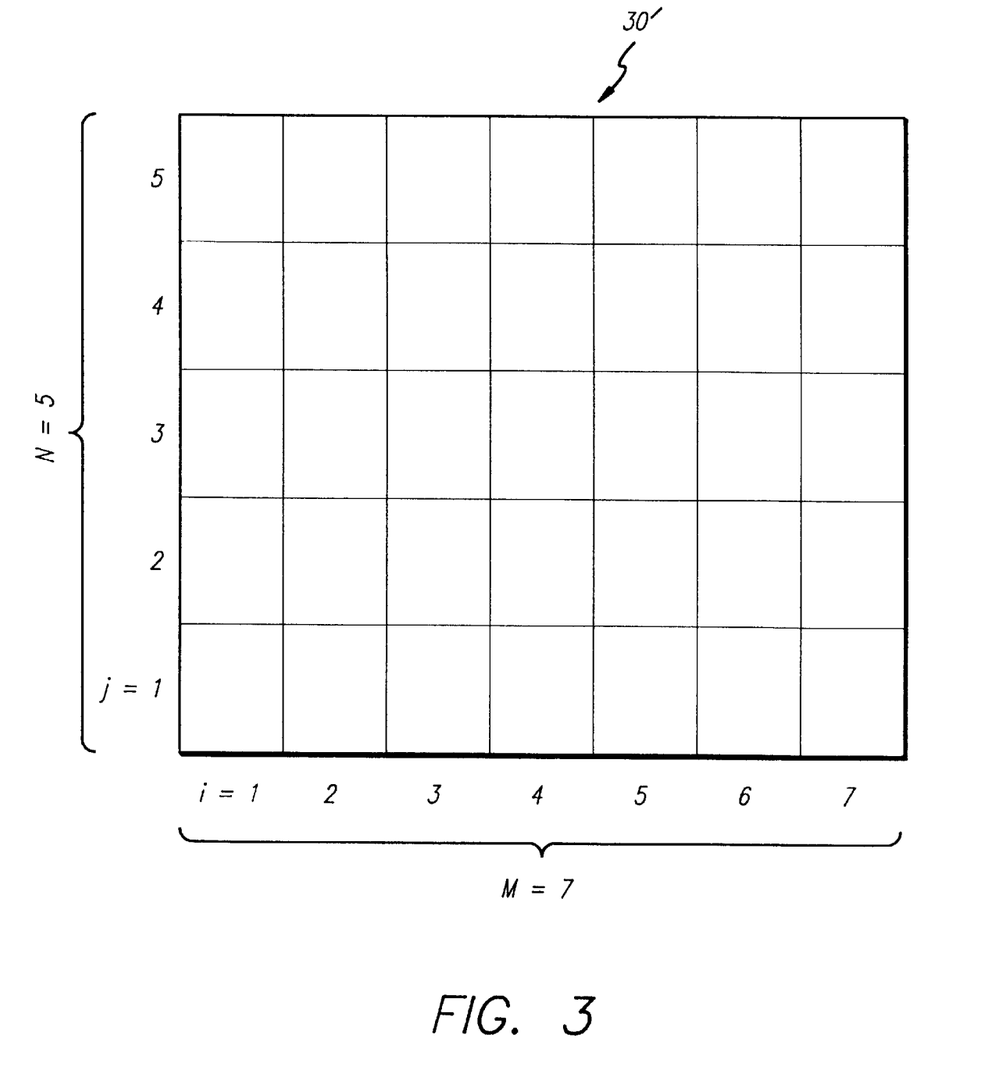
FIG. 3 illustrates an embodiment of the core region partition in accordance with the present invention.

The number of columns M and the number of rows N are predetermined and can be arbitrarily set. However, the value of M is typically set as one half of the number of cell columns in the core area, and the value of N is typically equal to M. FIG. 3 shows the core area 30' which has been divided into 35 rectangular regions with M=7 and N=5. The rectangular regions of the core area 30' are still referred to as $R_{i,j}$ where i indicates the column and j indicates the row of the position which the region occupies.

The column "interval parameter," denoted KX, may be any number greater than one and less than M. The row "interval parameter," denoted KY, may be any number greater than one and less than N. The interval parameters are used in sequencing the rectangular regions as will be discussed more fully below. Although KY and KY may be assigned arbitrary values within the respective limits, it has been found that good choices for KX and for KY are:

$KX=KY=\frac{1}{2}((MN/3)^{}\frac{1}{2})$ if the number of columns of cells in the core area is less than 100; and $KX=KY=\frac{1}{2}((MN/2)^{}\frac{1}{2})$ if the number of columns of cells in the core area is greater than or equal to 100.

Figure 4:
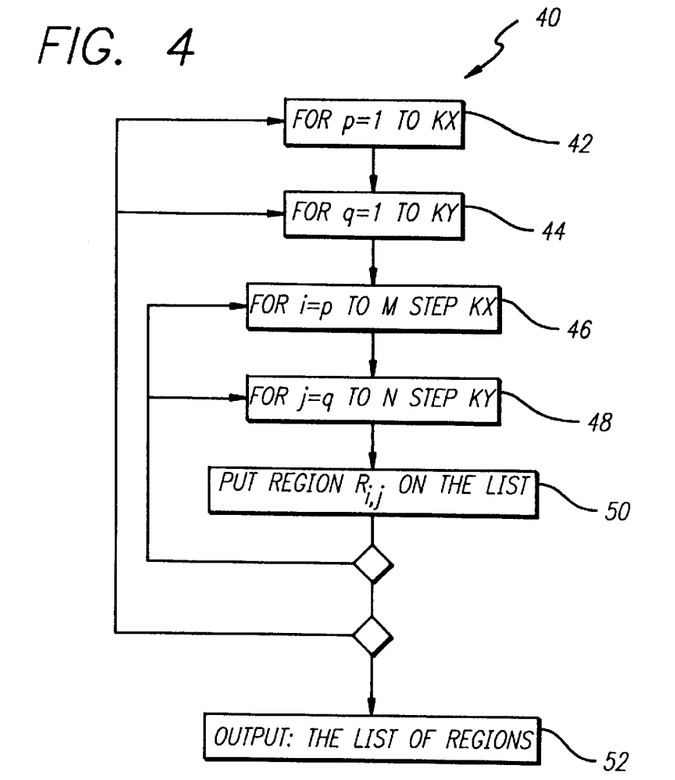
FIG. 4 is a flow-chart illustrating a method of sequencing core area regions in accordance with the present invention.

Referring now to FIG. 4, a flowchart 40 outlines the steps which may be used to create the desired sequence. The flowchart 40 of FIG. 4 includes a plurality of nested loops indicated by lines ending with arrow points. This notation indicates that all of the steps included within each loop are to be performed for all outer loops.

To create the sequence, the first operation, as indicated by the reference number 42 of FIG. 4, is to traverse columns one (1) through the $KX^{th}$ column using a first index, which will be denoted as p to facilitate this discussion.

For each of the columns traversed by p, a second index, denoted as q for the purposes of this discussion, is used to traverse the rows one (1) through the $KY^{th}$ row. This is indicated by the operation referred to by the reference number 44.

As indicated by the operation 46, for each of the columns traversed by p, denoted $C_p$ for the purposes of this discussion, the column index i is used to traverse the column $C_p$ and all the columns of the core area 30', which is a multiple of KX columns away from $C_p$. Therefore, in general, the column traversal, for each value of the index p, will be:

$C_p, C_{p+KX}, C_{p+2KX}, \ldots C_{p+nKX}$ where $nKX \leq M$ and n is an integer multiple.

For the instant example, the column traversal will be for p=1: $C_1$, $C_4$, and $C_7$;

for p=2: $C_2$, and $C_5$; and for p=3: $C_3$, and $C_6$.

The index p will not reach 4 because KX=3.

Operation 48 shows that, for each row traversed by q, denoted $W_q$ for the purposes of this discussion, the row index j is used to traverse the row $W_q$ and all the rows of the core area 30', which is a multiple of KY rows away from $W_q$. Therefore, in general, the row traversal, for each value of the index q, will be:

$W_q, W_{q+KY}, W_{q+2KY}, \ldots W_{q+nKY}$ where $nKY \leq N$ and n is an integer multiple.

For the instant example, the row traversal will be:

for q=1: $W_1$, $W_3$, and $W_5$; and for q=2: $W_2$, and $W_4$.

The index q will not reach 3 because KY=2.

Using the indices i and j to traverse columns and rows in the above described manner, the sequence is created, as indicated by operation 50, by adding the region $R_{i,j}$ to the sequence during the traversal. Finally, the list of the regions is finalized 52 and output is created.

The above-described operations to produce a sequence of regions $R_{i,j}$ can be expressed using pseudo-computer programming language as follows:

```
for p = 1 to KX do
    for q = 1 to KY do
        for i = p to M step KX do
            for q = to N step KY do
                assign R_{i,j} to the list
            enddo
        enddo
    enddo
enddo
```

Alternatively, using a repeat-until construct, the pseudo-program becomes:

```
p = 1
repeat
    q = 1
    repeat
        i = p
        repeat
            j = q
            repeat
                assign R_i,j to the list
                j = j + KY
            until j > N
            i = i + KX
        until i > M
        q = q + 1
    until q > KY
    p = p + 1
until p > KX
```

Utilizing the operations as described above, and using the values discussed previously, the core area 30' of FIG. 3 will be processed in the sequence indicated by Table 4 below.

TABLE 4

| Row | | | | | | | |
|---|---|---|---|---|---|---|---|
| 5 | 3 ($P_3$) | 18 | 28 | 6 | 21 | 31 | 9 |
| 4 | 11 | 23 | 33 | 13 | 25 | 35 | 15 |
| 3 | 2 ($P_2$) | 17 | 27 | 5 | 20 | 30 | 8 |
| 2 | 10 | 22 | 32 | 12 | 24 | 34 | 14 |
| j = 1 | 1 ($P_1$) | 16 | 26 | 4 | 19 | 29 | 7 |
| | i = 1 | 2 | 3 | 4 | 5 | 6 | 7 |
| | Column | | | | | | |

The entire Table 4 represents the core area 30' of FIG. 3, and each of the cells of the table represents the corresponding rectangular region of FIG. 3. In the table, each of the regions has a number representing the region's rank in the processing order. The specific processor which will process the region is identified for the first three regions only. This is because once the sequence is determined, the regions are assigned to the processors as follows: (1) initially, each of the processors are assigned to the first available, unassigned regions in accordance with the sequence; (2) from then on, the next region to be processed according to the sequence is assigned to the next available processor. A processor becomes available when it finishes the processing of the cells of its currently assigned area.

In the instant example, the first three regions of the sequence, $R_{1,1}$, $R_{1,3}$, and $R_{1,5}$ are initially assigned to processors $P_1$, $P_2$, and $P_3$, respectively. Then, the next region of the sequence, $R_{4,1}$, is assigned to the first processor which becomes available. For example, if $P_2$ finishes processing of the cells of region $R_{1,3}$ before $P_1$ and $P_3$ finish processing their assigned regions, then $P_2$ is assigned to $R_{4,1}$, the fourth region of the sequence. Likewise, the fifth region of the sequence, $R_{4,3}$, is assigned to the next available processor, and so on.

The above described assignment technique increases the effectiveness of parallel processing because no processor has to wait idly for another processor to finish its operation before processing another region. The effect of the above discussed assignment technique on the overall performance of the placement algorithm is most evident when the number of cells in each of the rectangular regions varies or when processors are operating at different speeds from each other.

Table 5 below sets forth one possible order in which the regions may be simultaneously processed by the processors.

TABLE 5

| Iteration | Set of regions simultaneously processed by $P_1$, $P_2$, and $P_3$ |
|---|---|
| 1 | $R_{1,1}$, $R_{1,3}$, and $R_{1,5}$ |
| 2 | $R_{4,1}$, $R_{4,3}$, and $R_{4,5}$ |
| ... | ... |
| 8 | $R_{2,2}$, $R_{2,4}$, and $R_{5,2}$ |
| ... | ... |
| 12 | $R_{6,2}$ and $R_{6,4}$ |

As Tables 4 and 5 illustrate, no two adjacent regions are processed multaneously in this example. In particular, note that regions $R_{2,2}$, $R_{2,3}$, and $R_{2,4}$, which caused area-conflict, deadlock, and local optimum concerns under the old technique, are not processed simultaneously.

Under the new cell placement process described above, the first set of regions to be simultaneously processed by the three processors are $R_{1,1}$, $R_{1,3}$, and $R_{1,5}$. Then, the second set of regions are processed simultaneously, followed by the simultaneous processing of the third set of regions, and so on. In addition, after each iteration of simultaneous processing, a database or a list of cells located in each of the regions is updated to reflect the current location of each of the cells of the core area 30'.

However, it is possible, even under the new cell placement process, for some conflicts to exist. The eighth iteration of the new process, as detailed by Tables 4 and 5 may be used to illustrate the advantages of the new process even where some conflicts occur.

The eighth iteration of the cell placement process involves the regions $R_{2,2}$, $R_{2,4}$, and $R_{5,2}$ being processed simultaneously by processors $P_1$, $P_2$, and $P_3$, respectively. As FIG. 2 indicates, regions $R_{2,2}$, $R_{2,4}$, and $R_{5,2}$ require the cell movements, or cell swaps, to increase the fitness of the placement as detailed in Table 6 below.

TABLE 6

| | |
|---|---|
| R2,2 | Cell movements 32a between $R_{2,2}$ and $R_{4,1}$; |
| | Cell movements 32b between $R_{2,2}$ and $R_{3,2}$; |
| | Cell movements 32c between $R_{2,2}$ and $R_{1,2}$; |
| | Cell movements 32d between $R_{2,2}$ and $R_{2,3}$; and |
| | Cell movements 36 between $R_{2,2}$ and $R_{2,4}$. |
| R2,4 | Cell movements 34a between $R_{2,4}$ and $R_{4,5}$; |
| | Cell movements 34b between $R_{2,4}$ and $R_{2,5}$; |
| | Cell movements 34c between $R_{2,4}$ and $R_{1,4}$; |
| | Cell movements 34d between $R_{2,4}$ and $R_{2,3}$; and |
| | Cell movements 36 between $R_{2,4}$ and $R_{2,2}$. |
| R5,2 | Cell movements 38a between $R_{5,2}$ and $R_{6,4}$; |
| | Cell movements 38b between $R_{5,2}$ and $R_{4,2}$; |
| | Cell movements 38c between $R_{5,2}$ and $R_{6,2}$; and |
| | Cell movements 38d between $R_{5,2}$ and $R_{6,2}$. |

In this scenario, only one area-conflict problem exists. The area-conflict is between $P_1$ (processing $R_{2,2}$) and $P_2$ (processing $R_{2,4}$). Both $P_1$ and $P_2$ are attempting to make cell movements 36 into and out of the region being processed by the other processor. No deadlock is possible in this situation because the area being processed by $P_3$ does not intersect with any areas being processed by processors $P_1$ and $P_2$. Finally, with a greatly decreased number of area-conflicts and no possibility of deadlocks, restrictions on the movements of cells are not necessary and are eliminated.

Figure 5:
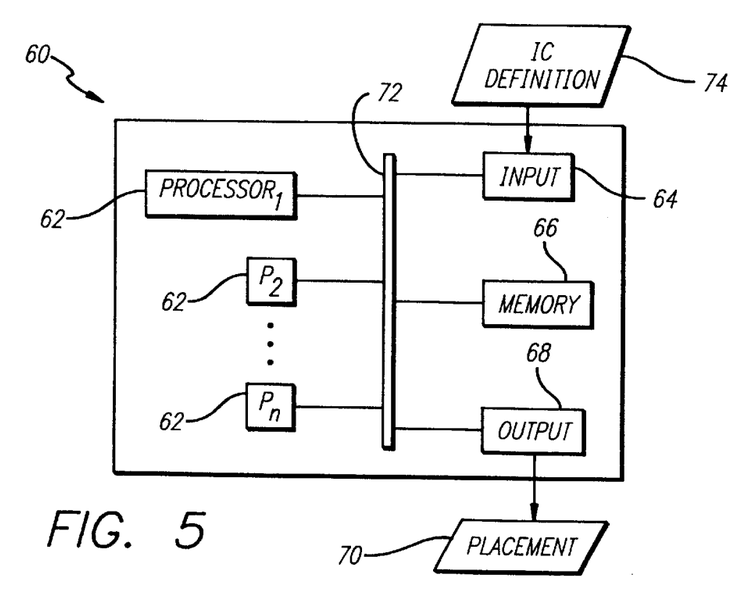
FIG. 5 is a diagram of the cell placement apparatus according to the present invention.

Referring now to FIG. 5, an apparatus 60 for placing cells on an integrated circuit chip is illustrated. The apparatus 60 comprises a plurality of processors 62 and memory 66 for storing instructions for the processors 62 as described above. The processors 62 may be of any commercially produced RISC or CISC processors commonly made by any of a number of vendors, or custom made processors such as LSI Logic's CoreWare modules. The processors and the memory is connected 72. Also connected to the processors 62 and memory 66 are an input device 64 and an output device 68 for retrieving the initial integrated circuit chip information 74 to the apparatus 60 and for outputting the final cell placement information 70.

Figure 6:
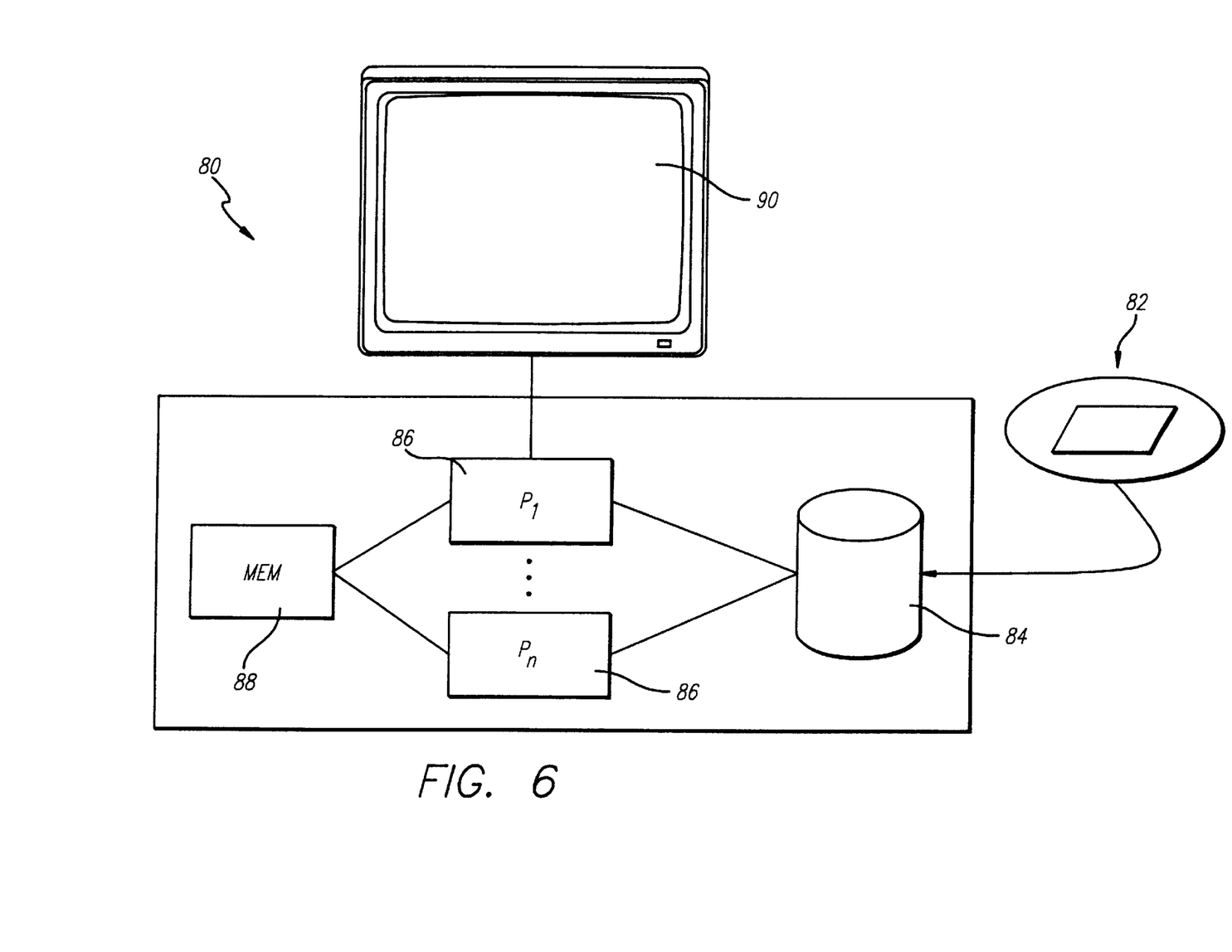
FIG. 6 is a block diagram of the cell placement system according to the present invention.

Referring now to FIG. 6, a system 80 for placing cells on an integrated circuit chip is illustrated. The system 80 comprises a plurality of processors 86 connected to memory 88 and a harddrive 84. The harddrive 84 includes the integrated circuit chip 82 definitions. The memory 88 includes instructions for the processors 86 to read the IC definitions from the harddrive 84, place the cells on the IC, and write the cell placement back onto the harddrive 84.

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer harddrives, and other magnetic, optical, other machine readable media, whether alone or in combination with one or more of the algorithms and steps described herein.

Although the present invention has been described in detail with regarding the exemplary embodiments and drawings thereof, it should be apparent to those skilled in the art that various adaptations and modifications of the present invention may be accomplished without departing from the spirit and the scope of the invention. Thus, by way of example and not of limitation, the present invention is discussed as illustrated by the figures. Accordingly, the invention is not limited to the precise embodiment shown in the drawings and described in detail herein above.

More specifically, the foregoing detailed description of the sequencing of the rectangular regions uses the "left-right and bottom-up" order beginning at the lower left corner of the region, $R_{1,1}$. However, the invention is not limited to this method of sequencing. In fact, the sequence order can be left-right and top-down, right-left and bottom-up, right-left and top-down, or any other sequence which would systematically assign sufficiently distant regions to the multiple processors to minimize the problems associated with multiple processing of cell placement algorithms.

We claim:

1. A method of placing elements on a surface, said method comprising the steps:
    a. dividing the surface into a plurality of regions, each of said regions being similar in size;
    b. assigning a set of non-adjacent regions to each of a plurality of processors wherein said non-adjacency is met when a first region and a second region is separated by a third region; and
    c. placing the elements of said non-adjacent regions.

2. The method as defined in claim 1 wherein steps b and c are iterated until all of said plurality of regions are processed.

3. The method as defined in claim 2 further comprising steps:
    d. maintaining a list of elements located within each of said plurality of regions; and
    e. updating said list of elements after each iteration of steps b and c.

4. The method as defined in claim 1 further comprising the steps:

d. determining fitness of said placement; and
    e. repeating steps b through d until a predetermined level of fitness is achieved.

5. The method as defined in claim 1 wherein said processing is performed using a simulated annealing technique wherein a first element of a first region is swapped with a second element of a second region.

6. The method as defined in claim 1 wherein the elements are cells of an integrated circuit chip (IC) and the surface is the IC.

7. A method of using multiple processors to achieve a cell placement layout of a core area of an integrated circuit, said method comprising the steps:
    a. dividing the core area into a plurality of regions, each of said regions containing a plurality of cells, and each of said regions being adjacent to one or more of surrounding regions of similar size;
    b. creating, for each of said regions, a list of cells belonging to said region;
    c. creating a non-adjacent set of regions from said plurality of regions wherein said non-adjacency is met when a first region and a second region is separated by a third region;
    d. assigning said regions belonging to said non-adjacent set to the multiple processors, one region per processor;
    e. processing said cells of each of said regions belonging to said non-adjacent set; and
    f. updating said lists of cells for each of said regions.

8. The method as defined by claim 7 wherein the core is divided into rectangular regions in M columns and N rows to define MN regions.

9. The method as defined by claim 8 wherein said property of non-adjacency is met when said first region is KX regions away from said second region, said KX having a value greater than one and less than M.

10. The method as defined by claim 8 wherein said property of non-adjacency is met when said first region is KY regions away from said second region, said KY having a value greater than one and less than N.

11. The method as defined by claim 8 wherein the core area further comprises a plurality of cell columns and said M has a value of one half of the number of cell columns of the core area.

12. The method as defined by claim 8 wherein the core area further comprises a plurality of cell columns and said N has a value of one half of the number of cell columns of the core area.

13. The method as defined by claim 7 further comprising:
    g. determining fitness of the core; and
    h. iterating steps c through g until a predetermined level of fitness is achieved.

14. The method as defined by claim 13 wherein when iterating steps c through g, each new non-adjacent set includes unprocessed regions.

15. A method of using multiple processors to achieve a cell placement layout of a core area of an integrated circuit, said method comprising the steps:
    a. dividing the core area into rectangular regions of M columns and N rows, each of said rectangular regions being designated $R_{i,j}$ where a column index i, having a value, represents the $i^{th}$ column and row index j, having a value, represents the $j^{th}$ row;
    b. choosing a first parameter KX having a value;
    c. choosing a second parameter KY having a value;
    d. creating a sequence, having, as elements, said rectangular regions $R_{i,j}$, by:

i. assigning value of 1 to a first index p;
ii. assigning value of 1 to a second index q;
iii. assigning said value of said p to said i;
iv. assigning said value of said q to said j;
v. assigning rectangular area $R_{i,j}$ as the next element of said sequence;
vi. incrementing value of said j by value of said KY;
vii. repeating steps v and vi until value of said j is greater than value of said N;
viii. incrementing value of said i by value of said KX;
ix. repeating steps iv to viii until value of said i is greater than value of said M;
x. incrementing value of said q by 1;
xi. repeating steps iii to x until value of said q is greater than value of said KY;
xii. incrementing value of said p by 1;
xiii. repeating steps ii to xii until value of said q is greater than value of said KY; and
e. assigning said rectangular regions to each of the multiple processors according to said sequence.

16. The method as defined by claim 15 wherein said core area comprises cell columns.

17. The method as defined by claim 15 wherein said M is assigned the value equal to one half of the number of said cell columns.

18. The method as defined by claim 15 wherein said N is assigned the value equal to one half of the number of said cell columns.

19. The method as defined by claim 15 wherein said core area comprises cell columns and said N is assigned the value equal to the number of cell columns of the core area divided by two.

20. The method as defined by claim 15 wherein said value of M is equal to said value of N.

21. The method as defined by claim 15 wherein said KX is assigned a value of one half of square root of an intermediate value which is M multiplied by N divided by three.

22. The method as defined by claim 15 wherein said KY is assigned a value of one half of square root of an intermediate value which is M multiplied by N divided by three.

23. The method as defined by claim 15 wherein said KX is assigned a value of one half of square root of an intermediate value which is M multiplied by N divided by two.

24. The method as defined by claim 15 wherein said KY is assigned a value of one half of square root of an intermediate value which is M multiplied by N divided by two.

25. The method as defined by claim 15 wherein said value of KX is equal to said value of KY.

26. The method as defined by claim 15 wherein said value of KX is greater than 1 and less than M.

27. The method as defined by claim 15 wherein said value of KY is greater than 1 and less than N.

28. A computer storage medium containing instructions using multiple processors to achieve a cell placement layout of a core area of an integrated circuit, said method comprising the steps:

dividing the core area into a plurality of regions, each of said regions containing a plurality of cells, and each of said regions being adjacent to one or more of surrounding regions of similar size;

creating, for each of said regions, a list of cells belonging to said region;

creating a non-adjacent set of regions from said plurality of regions wherein said non-adjacency is met when a first region and a second region is separated by a third region;

assigning said regions belonging to said non-adjacent set to the multiple processors, one region per processor;

processing said cells of each of said regions belonging to said non-adjacent set; and updating said lists of cells for each of said regions.

29. The storage medium according to claim 28 wherein said storage medium is selected from a group consisting of magnetic device, optical device, magneto-optical device, floppy diskette, CD-ROM, magnetic tape, computer harddrive, and memory card.

30. An apparatus for placing cells on an integrated circuit chip, said apparatus comprising:

a. a plurality of processors;
b. memory connected to said processors; and
c. said memory having instructions for said processors to divide the area of said circuit chip into a plurality of similarly sized regions and to successively assign non-adjacent regions to said processors for said processors to place the cells onto said circuit chip wherein said non-adjacency is met when a first region and a second region is separated by a third region.

31. The apparatus of claim 30 wherein said plurality of processors operate simultaneously to place the cells on the circuit chip.

32. The apparatus of claim 30 wherein the memory further comprises instructions for the processors to maintain a list of cells located within each of said regions.

33. The apparatus of claim 30 further comprising an input device and an output device connected to said processors.

34. The apparatus of claim 30 wherein the memory further comprises instructions for the processors to determine fitness of cell placement.

35. A cell placement system comprising:

a. an integrated circuit chip having surface area;
b. a computer having memory and a plurality of processors; and
c. said memory storing instructions for said processors to divide the area of said circuit chip into a plurality of similarly sized regions and successively assign non-adjacent regions to said processors for said processors to place the cells onto said circuit chip wherein said non-adjacency is met when a first region and a second region is separated by a third region.

36. The system of claim 35 wherein said computer further comprises a harddrive connected to said processors.

37. The system of claim 35 wherein said plurality of processors operate simultaneously to place the cells on the circuit chip.

38. The system of claim 35 wherein said memory further comprises instructions for the processors to maintain a list of cells located within each of said regions.

39. The system of claim 35 wherein the memory further comprises instructions for the processors to determine fitness of cell placement.

* * * * *